US009224578B2

United States Patent
Nakayamada et al.

(10) Patent No.: US 9,224,578 B2
(45) Date of Patent: Dec. 29, 2015

(54) CHARGED PARTICLE BEAM WRITING APPARATUS AND METHOD FOR ACQUIRING DOSE MODULATION COEFFICIENT OF CHARGED PARTICLE BEAM

(71) Applicant: NuFlare Technology, Inc., Yokohama (JP)

(72) Inventors: Noriaki Nakayamada, Kanagawa (JP); Yasuo Kato, Kanagawa (JP); Mizuna Suganuma, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 119 days.

(21) Appl. No.: 14/221,916

(22) Filed: Mar. 21, 2014

(65) Prior Publication Data

US 2014/0291553 A1  Oct. 2, 2014

(30) Foreign Application Priority Data

Mar. 27, 2013 (JP) .................. 2013-067117

(51) Int. Cl.
*H01J 37/317* (2006.01)
*H01J 37/302* (2006.01)
*G03F 7/20* (2006.01)

(52) U.S. Cl.
CPC ........... *H01J 37/3174* (2013.01); *G03F 7/2061* (2013.01); *G03F 7/2063* (2013.01); *H01J 37/3026* (2013.01); *H01J 2237/31764* (2013.01); *H01J 2237/31776* (2013.01)

(58) Field of Classification Search
None
See application file for complete search history.

(56) References Cited

U.S. PATENT DOCUMENTS

| | | | |
|---|---|---|---|
| 5,847,959 A | 12/1998 | Veneklasen et al. | |
| 6,110,627 A * | 8/2000 | Nakasuji | H01J 37/3174 430/296 |
| 6,373,071 B1 * | 4/2002 | Innes | G03F 7/2063 250/492.22 |
| 6,379,851 B1 * | 4/2002 | Innes | H01J 37/3174 430/296 |
| 6,720,565 B2 * | 4/2004 | Innes | G03F 7/2063 250/492.22 |
| 7,498,591 B2 * | 3/2009 | Lozes | H01J 37/3174 250/491.1 |

(Continued)

FOREIGN PATENT DOCUMENTS

| | | |
|---|---|---|
| JP | 2007-157742 | 6/2007 |
| JP | 4364310 | 11/2009 |

(Continued)

OTHER PUBLICATIONS

Office Action issued Jul. 17, 2015 in Korean Patent Application No. 10-2014-0035363 (with English language translation).

*Primary Examiner* — Jack Berman

(74) *Attorney, Agent, or Firm* — Oblon, McClelland, Maier & Neustadt, L.L.P.

(57) ABSTRACT

A apparatus includes a unit to operate a first dose of a beam corrected for a proximity effect for each of second mesh regions of a second mesh size obtained by dividing the first mesh size by a product of a natural number and a number of passes, by using a dose model using a dose threshold; a unit to operate a representative temperature rising due to heat transfer originating from irradiation of the beam by using a dose for an applicable pass of the first dose and a unit to operate a polynomial having a term obtained by multiplying a dose modulation coefficient based on the representative temperature by a pattern area density as an element, and a dose that makes a difference between a value obtained by operating the polynomial and the dose threshold within a tolerance is used.

11 Claims, 7 Drawing Sheets

(56) References Cited

U.S. PATENT DOCUMENTS

| | | |
|---|---|---|
| 8,563,953 B2 | 10/2013 | Nakayamada et al. |
| 2012/0068089 A1 | 3/2012 | Nakayamada et al. |
| 2013/0316288 A1* | 11/2013 | Nakayamada ........ G03F 7/2061 430/296 |

FOREIGN PATENT DOCUMENTS

| | | |
|---|---|---|
| JP | 2010-98275 A | 4/2010 |
| JP | 2012-69675 | 4/2012 |
| KR | 10-2012-0031136 A | 3/2012 |

* cited by examiner

CHARGED PARTICLE BEAM WRITING APPARATUS AND METHOD FOR ACQUIRING DOSE MODULATION COEFFICIENT OF CHARGED PARTICLE BEAM

CROSS-REFERENCE TO RELATED APPLICATION

This application is based upon and claims the benefit of priority from prior Japanese Patent Application No. 2013-067117 filed on Mar. 27, 2013 in Japan, the entire contents of which are incorporated herein by reference.

BACKGROUND OF THE INVENTION

1. Field of the Invention

Embodiments described herein relate generally to a charged particle beam writing apparatus and a method for acquiring a dose modulation coefficient of a charged particle beam, and for example, relates to an apparatus and a method for making resist heating corrections.

2. Related Art

Writing technology in charge of developing still finer semiconductor devices is, among semiconductor manufacturing processes, an extremely important process that generates patterns as the only one process. In recent years, with an ever higher degree of integration of LSI, circuit line widths demanded from semiconductor devices become finer year by year. A high-precision original pattern (also called a reticle or a mask) is needed to form a desired circuit pattern on these semiconductor devices. An electron beam (EB) writing technology has inherently superior resolving properties and is used to manufacture high-precision original patterns.

FIG. 8 is a conceptual diagram illustrating an operation of a conventional variable-shaped electron beam writing apparatus.

The variable-shaped electron beam writing apparatus operates as described below. A first aperture plate 410 has a rectangular opening 411 to shape an electron beam 330 formed therein. A second aperture plate 420 has a variable-shaped opening 421 to shape the electron beam 330 having passed through the opening 411 of the first aperture plate 410 to a desired rectangular shape formed therein. The electron beam 330 having passed through the opening 411 of the first aperture plate 410 after being irradiated from a charged particle source 430 is deflected by a deflector and passes through a portion of the variable-shaped opening 421 of the second aperture plate 420 before a target object 340 mounted on a stage continuously moving in one direction (for example, assumed to be the X direction) being irradiated by the electron beam 330. That is, a rectangular shape capable of passing through both of the opening 411 of the first aperture plate 410 and the variable-shaped opening 421 of the second aperture plate 420 is written in a pattern writing region of the target object 340 mounted on the stage continuously moving in the X direction. The method for creating an arbitrary shape by causing a beam to pass through both of the opening 411 of the first aperture plate 410 and the variable-shaped opening 421 of the second aperture plate 420 is called the variable-shaped method (VSB method).

With the development of optical writing technology and shorter wavelengths due to an extreme ultraviolet (EUV), the number of shots of an electron beam needed to write a mask is increasing at an accelerated pace. On the other hand, shot noise and edge roughness of patterns are reduced by making a resist less sensitive and increasing the dose to ensure the precision of line width needed for micropatterning. Thus, the number of shots and the dose increase boundlessly and so the pattern writing time also increases boundlessly. Therefore, reducing the pattern writing time by increasing a current density is discussed.

However, if an increased irradiation energy amount is irradiated in a short time as a denser electron beam, a problem of phenomenon called resist heating is caused in which the substrate temperature is heated and resist sensitivity is changed, resulting in worse precision of line width. Thus, to solve such a problem, the inventors and the like have applied for a patent a technique of calculating a representative temperature for each minimum deflection region of deflection regions based on heat transfer from other minimum deflection regions written before the minimum deflection region and modulating the dose using the representative temperature (see Published Unexamined Japanese Patent Application No. 2012-069675 (JP-A-2012-069675), for example). Dimensional variations of patterns due to resist heating have been suppressed by making corrections in minimum deflection region units, instead of shots units, according to such a technique to perform a correction operation (temperature correction operation) at a higher speed.

In electron beam pattern writing, on the other hand, when a circuit pattern is written by irradiating a mask to which a resist is applied with an electron beam, a phenomenon called the proximity effect by back scattering in which the electron beam is transmitted through a resist layer to reach the layer thereunder before reentering the resist layer occurs. Accordingly, dimensional variations in which when a pattern is written, the pattern is written in dimensions deviating from desired dimensions occur. To avoid such a phenomenon, a proximity effect correction operation is performed by the writing apparatus to, for example, modulate the dose to suppress such dimensional variations.

However, even if the dose is modulated by performing a proximity effect correction operation, a problem of remaining correction residual is caused if thereafter, dose modulation to suppress dimensional variations due to resist heating is performed by performing aforementioned temperature correction operation.

In addition to the aforementioned temperature correction operation and dose modulation such as the proximity effect correction operation, the necessary dose is divided into a plurality of times of pattern writing by performing multiple pattern writing in electron beam pattern writing to suppress a temperature rise. The multiple pattern writing is frequently performed by shifting the position of a deflection region and in such a case, the aforementioned temperature correction operation needs to be performed for each pass (one-time pattern writing of multiple pattern writing) of multiple pattern writing because the position of the deflection region is shifted. Thus, if a proximity effect correction operation is combined therewith, the operation technique becomes still more complex and a problem of difficulty of a real-time correction operation is caused. Thus, process efficiency needs to be increased.

BRIEF SUMMARY OF THE INVENTION

In accordance with one aspect of this invention, a charged particle beam writing apparatus includes a first mesh division unit configured to virtually divide a pattern writing region of a target object into a plurality of first mesh regions in a first mesh size;

a second mesh division unit configured to virtually divide the pattern writing region of the target object into a plurality of second mesh regions in a second mesh size obtained by dividing the first mesh size by a product of a natural number and a number of passes of multiple pattern writing performed by shifting a position;

a first dose operation unit configured to operate a first dose of a charged particle beam corrected for a proximity effect for each of the plurality of second mesh regions by using a dose model using a dose threshold;

a representative temperature operation unit configured to operate a representative temperature of the first mesh region rising due to heat transfer originating from irradiation of the charged particle beam by using a dose for an applicable pass of the multiple pattern writing of the first dose operated, for each pass of the multiple pattern writing and each of the plurality of first mesh regions;

a polynomial operation unit configured to operate a polynomial having a term obtained by multiplying a dose modulation coefficient based on the representative temperature of each pass by a pattern area density for each of the plurality of second mesh regions as an element; and a pattern writing unit configured to write a pattern on the target object by using a charged particle beam of a dose that makes a difference between a value obtained by operating the polynomial and the dose threshold within a tolerance.

In accordance with another aspect of this invention, a method for acquiring a dose modulation coefficient of a charged particle beam includes:

virtually dividing a pattern writing region of a target object into a plurality of first mesh regions in a first mesh size;

virtually dividing the pattern writing region of the target object into a plurality of second mesh regions in a second mesh size obtained by dividing the first mesh size by a product of a natural number and a number of passes of multiple pattern writing performed by shifting a position;

operating a first dose of a charged particle beam corrected for a proximity effect for each of the plurality of second mesh regions by using a dose model using a dose threshold;

operating a representative temperature of the first mesh region rising due to heat transfer originating from irradiation of the charged particle beam by using a dose of an applicable pass of the multiple pattern writing of the first dose operated, for each pass of the multiple pattern writing and each of the plurality of first mesh regions;

operating a dose modulation coefficient to correct dimensional variations due to resist heating by using the representative temperature, for each pass of the multiple pattern writing and each of the plurality of first mesh regions; and operating and outputting an average value of dose modulation coefficients for each of a plurality of third mesh regions obtained by virtual division in a third mesh size obtained by dividing the first mesh size by a product of a natural number and the number of passes.

DETAILED DESCRIPTION OF THE INVENTION

In an embodiment below, an apparatus and a method capable of pattern writing that efficiently suppresses dimensional variations of patterns due to resist heating while suppressing correction residuals of the proximity effect even if multiple pattern writing is performed will be described.

Also in the embodiment below, a configuration using an electron beam will be described as an example of a charged particle beam. However, the charged particle beam is not limited to the electron beam and a beam using charged particles such as an ion beam may also be used. In addition, a variable-shaped writing apparatus will be described as an example of a charged particle beam apparatus.

Embodiment 1

Figure 1:
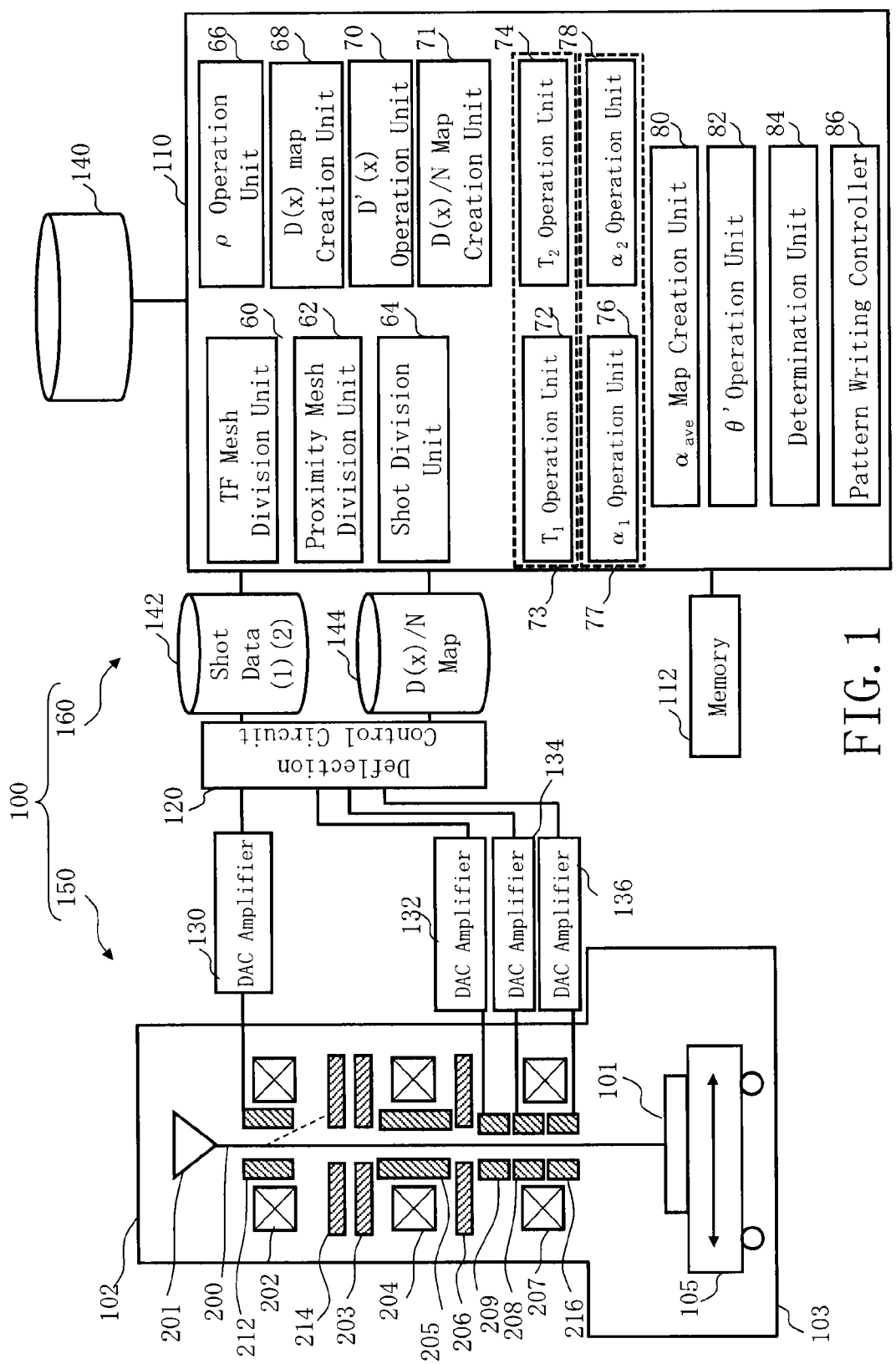
FIG. 1 is a conceptual diagram showing a configuration of a writing apparatus according to Embodiment 1.

FIG. 1 is a conceptual diagram showing the configuration of a writing apparatus according to Embodiment 1. In FIG. 1, a writing apparatus 100 includes a pattern writing unit 150 and a controller 160. The writing apparatus 100 is an example of the charged particle beam writing apparatus. In particular, the writing apparatus 100 is an example of the variable-shaped (VSB type) writing apparatus. The pattern writing unit 150 includes an electron optical column 102 and a pattern writing chamber 103. In the electron optical column 102, an electron gun assembly 201, an illumination lens 202, a blanking deflector (blanker) 212, a blanking aperture plate 214, a first shaped aperture plate 203, a projection lens 204, a deflector 205, a second shaped aperture plate 206, an objective lens 207, a main deflector 208, a sub-deflector 209, and a sub-sub-deflector 216 are arranged. In the pattern writing chamber 103, at least an XY stage 105 capable of moving in the XY directions is arranged. A target object 101 (substrate) to which a resist is applied and to which a pattern is to be written is arranged on the XY stage 105. The target object 101 includes masks for exposure to manufacture semiconductor devices and silicon wafers. Masks include mask blanks.

The controller 160 includes a control computer unit 110, a memory 112, a deflection control circuit 120, DAC (digital/analog converter) amplifier units 130, 132, 134, 136 (deflection amplifiers), and storage apparatuses 140, 142, 144 such as magnetic disk drives. The control computer unit 110, the deflection control circuit 120, and the storage apparatus 140 such as a magnetic disk drives are mutually connected via a bus (not shown). The DAC amplifier units 130, 132, 134, 136 are connected to the deflection control circuit 120. The DAC amplifier unit 130 is connected to the blanking deflector 212. The DAC amplifier unit 132 is connected to the sub-deflector 209. The DAC amplifier unit 134 is connected to the main deflector 208. The DAC amplifier unit 136 is connected to the sub-sub-deflector 216.

In the control computer unit 110, a TF mesh division unit 60, a proximity mesh division unit 62, a shot division unit 64, a ρ operation unit 66, a D(x) map creation unit 68, a D'(x) operation unit 70, a D(x)/N map creation unit 71, a T operation unit 73, an α operation unit 77, an $\alpha_{ave}$ map creation unit 80, a θ' operation unit 82, a determination unit 84, and a pattern writing controller 86 are arranged. Each function of the TF mesh division unit 60, the proximity mesh division unit 62, the shot division unit 64, the ρ operation unit 66, the D(x) map creation unit 68, the D'(x) operation unit 70, the D(x)/N map creation unit 71, the T operation unit 73, the α operation unit 77, the $α_{ave}$ map creation unit 80, the θ' operation unit 82, the determination unit 84, and the pattern writing controller 86 may also be configured by software such as a program. Alternatively, each function may be configured by hardware such as an electronic circuit or may be a combination thereof. Input data needed inside the control computer unit 110 or operation results are stored in the memory 112 each time. When at least one of the TF mesh division unit 60, the proximity mesh division unit 62, the shot division unit 64, the ρ operation unit 66, the D(x) map creation unit 68, the D'(x) operation unit 70, the D(x)/N map creation unit 71, the T operation unit 73, the α operation unit 77, the $α_{ave}$ map creation unit 80, the θ' operation unit 82, the determination unit 84, and the pattern writing controller 86 is configured by software, a computer such as a CPU or GPU is arranged. Particularly for a function of a large calculated amount such as the T operation unit 73, a computer of a plurality of CPU or a plurality of GPU is arranged.

The T operation unit 73 includes a plurality of Ti operation units (pass representative temperature operation units) operating a representative temperature Ti of each pass of multiple pattern writing. The example in FIG. 1 shows a case when the number of passes N=2 and so has a $T_1$ operation unit 72 and a $T_2$ operation unit 74. Similarly, the α operation unit 77 includes a plurality of αi operation units that operate a dose modulation coefficient αi of each pass of multiple pattern writing. The example in FIG. 1 shows a case when the number of passes N=2 and so has an $α_1$ operation unit 76 and an $α_2$ operation unit 78. Each of the functions of the $T_1$ operation unit 72, the $T_2$ operation unit 74, the $α_1$ operation unit 76, and the $α_2$ operation unit 78 may also be configured by software such as a program. Alternatively, each function may be configured by hardware such as an electronic circuit or may be a combination thereof. Input data needed inside the control computer unit 110 or operation results are stored in the memory 112 each time. When at least one of the $T_1$ operation unit 72, the $T_2$ operation unit 74, the $α_1$ operation unit 76, and the $α_2$ operation unit 78 is configured by software, a computer such as a CPU or GPU is arranged.

In Embodiment 1, a case when, for example, the number of passes (also called the "multiplicity" or "multiple pattern writing count") N=2 will be described. However, Embodiment 1 is not limited to such a case and the number of passes N may be a value equal to 3 or greater. While the $T_1$ operation unit 72 and the $T_2$ operation unit 74 are arranged, as shown in FIG. 1, when the number of passes N=2, as many Ti operation units as the number in accordance with the value of the number of passes N are arranged when the number of passes N≥3. Similarly, while the $α_1$ operation unit 76 and the $α_2$ operation unit 78 are arranged, as shown in FIG. 1, when the number of passes N=2, as many αi operation units as the number in accordance with the value of the number of passes N are arranged when the number of passes N≥3.

Pattern writing data is input from outside and stored in the storage apparatus 140.

FIG. 1 shows the configuration needed to describe Embodiment 1. Other components that are normally needed for the writing apparatus 100 may also be included.

Figure 2:
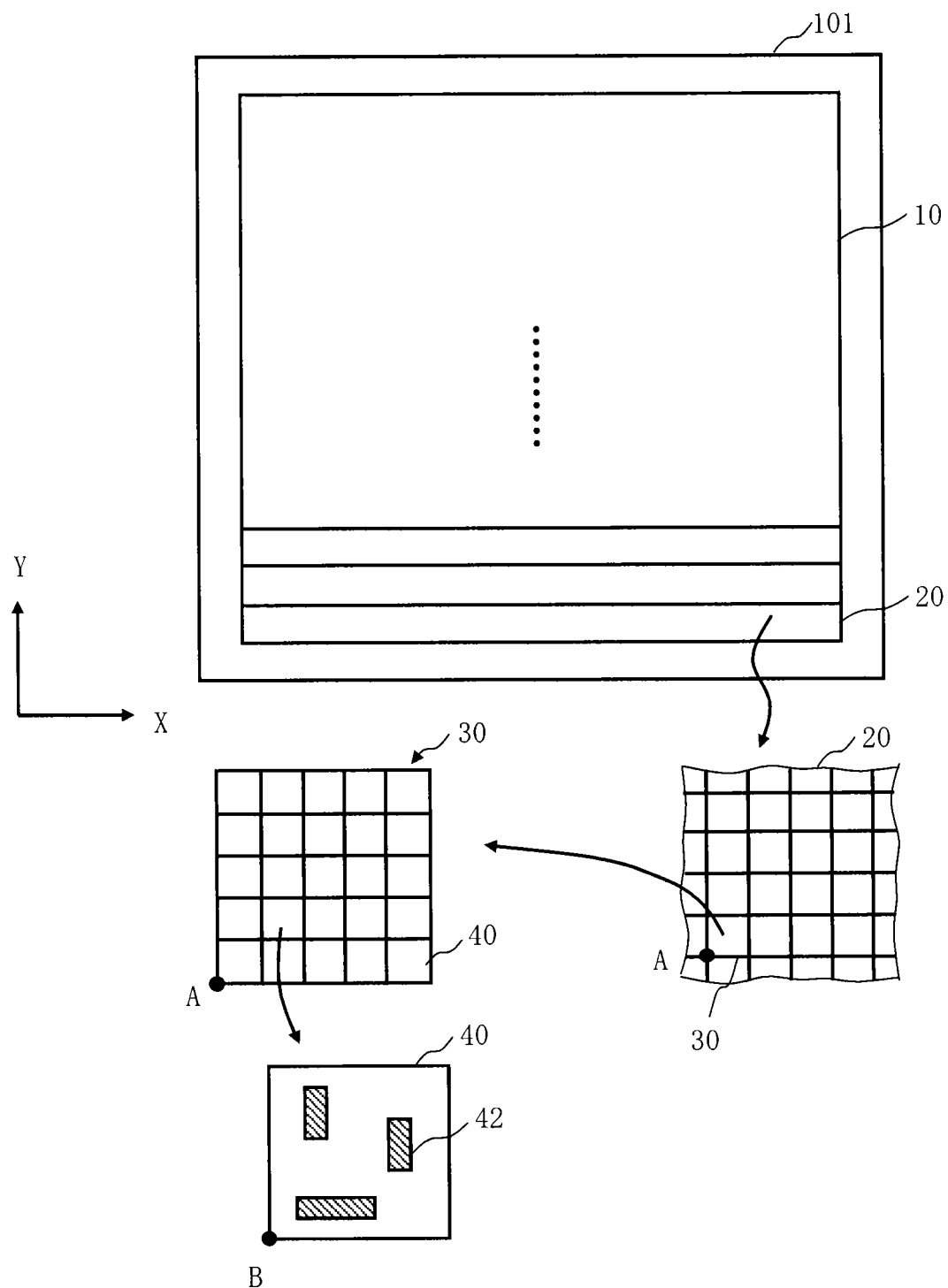
FIG. 2 is a conceptual diagram illustrating each region in Embodiment 1.

FIG. 2 is a conceptual diagram illustrating each region in Embodiment 1. In FIG. 2, a pattern writing region 10 of the target object 101 is virtually divided into a plurality of stripe regions 20 in a thin rectangular shape in a deflectable width by the main deflector 208 toward, for example, the Y direction. Each of the stripe regions 20 is virtually divided into a plurality of sub-fields (SF) 30 (small regions) in a mesh shape in a deflectable size by the sub-deflector 209. Then, each of the SF 30 is virtually divided into a plurality of under-sub-fields (USF: here, called "TF" using an abbreviation of Tertiary Field meaning the third deflection region. This also applies below.) 40 (small regions) in a mesh shape in a deflectable size by the sub-sub-deflector 216. Then, a shot figure is written in each shot position 42 of each of the TF 40. The number of TF divisions in each SF is desirably a number such that a pattern writing operation is not limited by the representative temperature calculation of TF. For example, the numbers are desirably 10 or less vertically and horizontally. Particularly suitably, the numbers are desirably 5 or less vertically and horizontally.

A digital signal for blanking control is output from the deflection control circuit 120 to the DAC amplifier unit 130. Then, the DAC amplifier unit 130 converts the digital signal into an analog signal and amplifies the signal before applying the signal to the blanking deflector 212 as a deflection voltage. An electron beam 200 is deflected by such a deflection voltage to form a beam of each shot.

A digital signal for main deflection control is output from the deflection control circuit 120 to the DAC amplifier unit 134. Then, the DAC amplifier unit 134 converts the digital signal into an analog signal and amplifies the signal before applying the signal to the main deflector 208 as a deflection voltage. The electron beam 200 is deflected by such a deflection voltage and a beam of each shot is deflected to the reference position of a predetermined sub-field (SF) virtually divided in a mesh shape.

A digital signal for sub-deflection control is output from the deflection control circuit 120 to the DAC amplifier unit 132. Then, the DAC amplifier unit 132 converts the digital signal into an analog signal and amplifies the signal before applying the signal to the sub-deflector 209 as a deflection voltage. The electron beam 200 is deflected by such a deflection voltage and a beam of each shot is deflected into a predetermined sub-field (SF) virtually divided in a mesh shape and further to the reference position of an under-sub-field (TF) virtually divided in a mesh shape and to be the minimum deflection region.

A digital signal for sub-sub-deflection control is output from the deflection control circuit 120 to the DAC amplifier unit 136. Then, the DAC amplifier unit 136 converts the digital signal into an analog signal and amplifies the signal before applying the signal to the sub-sub-deflector 216 as a deflection voltage. The electron beam 200 is deflected by such a deflection voltage and a beam of each shot is deflected into a predetermined sub-field (SF) virtually divided in a mesh shape and further to each shot position in an under-sub-field (TF) virtually divided in a mesh shape and to be the minimum deflection region.

The writing apparatus 100 performs pattern writing processing for each of the stripe regions 20 using a plurality of stages of deflectors. Here, as an example, 3-stage deflectors of the main deflector 208, the sub-deflector 209, and the sub-sub-deflector 216 are used. The XY stage 105 continuously moves in, for example, the −X direction to proceed with pattern writing in the X direction for the first stripe region 20. Then, after the pattern writing of the first stripe region 20 is completed, the XY stage 105 proceeds with pattern writing for the second stripe region 20 in the same manner or in a reverse direction. Subsequently, the XY stage 105 proceeds with pattern writing for the third stripe region 20 in the same manner. Then, the main deflector 208 (first deflector) in turn deflects the electron beam 200 to a reference position A of the SF 30 like following the movement of the XY stage 105. Also, the sub-deflector 209 (second deflector) in turn deflects the electron beam 200 from the reference position A of each of the SF 30 to a reference position B of the TF 40. Then, the sub-sub-deflector 216 (third deflector) deflects the electron beam 200 from the reference position B of each of the TF 40 to the shot position 42 of a beam irradiated into the TF 40. Thus, the main deflector 208, the sub-deflector 209, and the sub-sub-deflector 216 have deflection regions different in size. The TF 40 is the minimum deflection region of deflection regions of the plurality of stages of deflectors.

Figure 3:
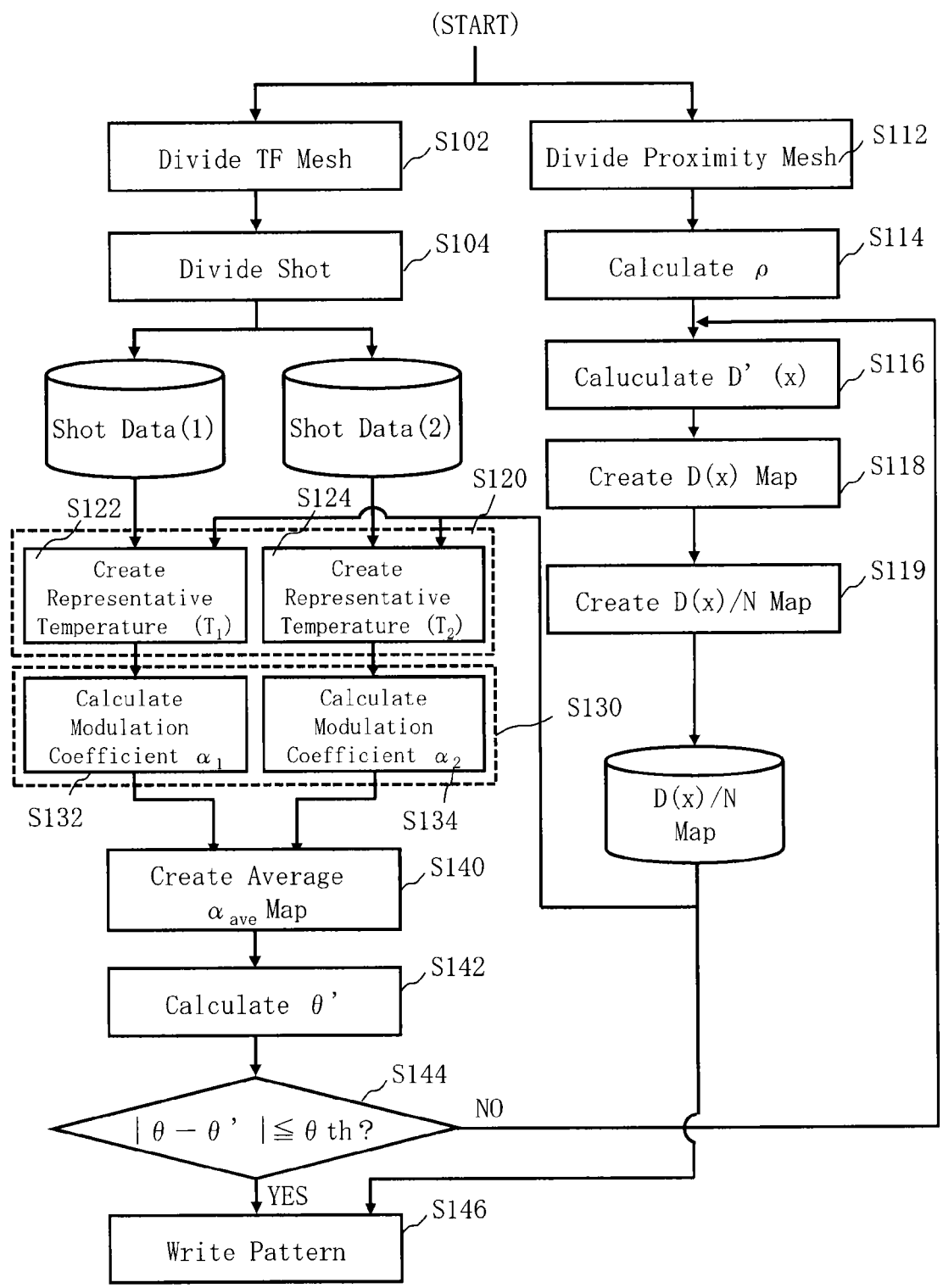
FIG. 3 is a flow chart showing principal processes of a method for writing a pattern in Embodiment 1.

FIG. 3 is a flow chart showing principal processes of a method for writing a pattern in Embodiment 1. In FIG. 3, the method for writing a pattern in Embodiment 1 executes a series of processes including a TF mesh division process (S102), a shot division process (S104), a proximity mesh division process (S112), a ρ operation process (S114), a D'(x) operation process (S116), a D(x) map creation process (S118), a D(x)/N map creation process (S119), a T operation process (S120), an α operation process (S130), an $α_{ave}$ map creation process (S140), a θ' operation process (S142), a determination process (S144), and a pattern writing process (S146). The T operation process (S120) executes a $T_1$ operation process (S122) and a $T_2$ operation process (S124) as internal processes thereof. The α operation process (S130) executes an $α_1$ operation process (S132) and an $α_2$ operation process (S134) as internal processes thereof. Of these processes, each of remaining processes excluding the pattern writing process (S146) constitutes a method for acquiring the dose modulation coefficient of an electron beam in Embodiment 1.

In Embodiment 1, a case of, for example, the number of passes N=2 will be described. However, Embodiment 1 is not limited to such a case and the number of passes N may be, as described above, a value equal to 3 or greater. When the number of passes N=2, as shown in FIG. 3, the T operation process (S120) executes the $T_1$ operation process (S122) and the $T_2$ operation process (S124) as internal processes thereof, but when the number of passes N≥3, as many Ti operation units as the number in accordance with the value of the number of passes N are executed. Similarly, the α operation process (S130) executes the $α_1$ operation process (S132) and the $α_2$ operation process (S134) as internal processes thereof, but when the number of passes N≥3, as many αi operation units as the number in accordance with the value of the number of passes N are executed.

As the TF mesh division process (S102), the TF mesh division unit 60 (first mesh division unit) virtually divides a pattern writing region of the target object 101 into a plurality of the TF 40 (first mesh regions) in a mesh shape in a deflectable size (first mesh size) by the sub-sub-deflector 216. Here, the stripe region 20 is first divided into a plurality of the SF 30 in a mesh shape and then each of the SF 30 is virtually divided into the plurality of the TF 40 in a mesh shape. In Embodiment 1, each of the TF 40 is used as a mesh region for temperature correction operation. The TF mesh division unit 60 virtually divides the pattern writing region of the target object 101 into the plurality of the TF 40 in a mesh shape (first mesh regions) for each pass (one-time pattern writing of multiple pattern writing) of multiple pattern writing.

Figure 4A:
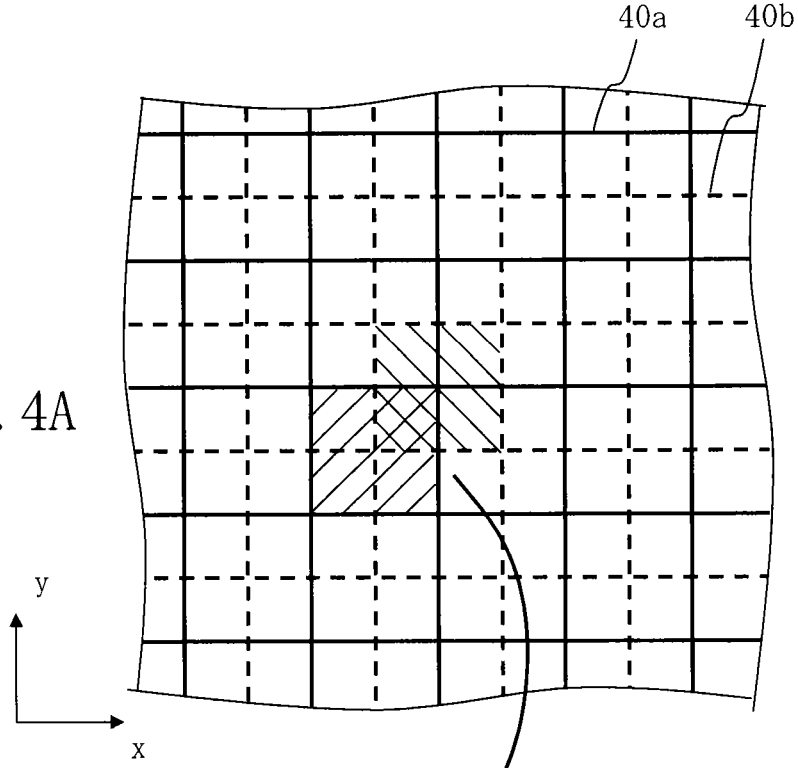
FIGS. 4A and 4B are diagrams showing TF of each pass in Embodiment 1.
Figure 4B:
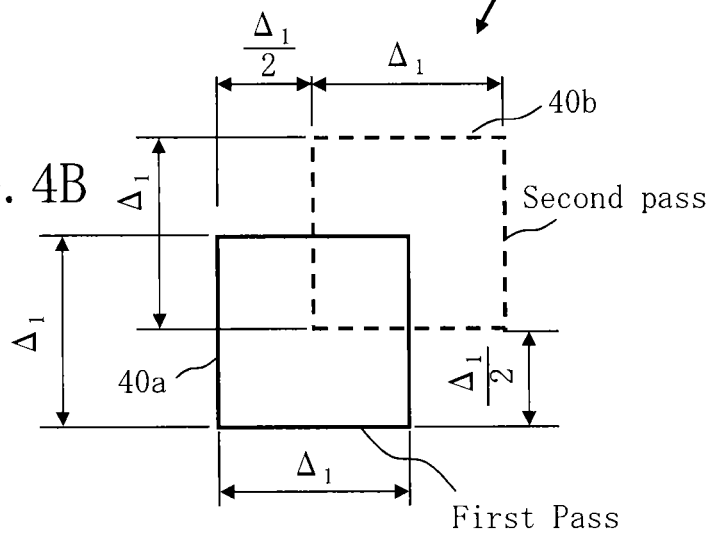

FIGS. 4A and 4B are diagrams showing TF of each pass in Embodiment 1. In FIG. 4A, TF 40a in the first pass is shown as a solid line and TF 40b in the second pass is shown as a dotted line. As shown in FIG. 4B, the TF 40 is divided as a square whose vertical and horizontal sizes (x size, y size) are both $Δ_1$. In the first and second passes, the TF 40 are generated by the position of the deflection region being shifted by $Δ_1/2$ in the x and y directions respectively.

As the shot division process (S104), the shot division unit 64 reads pattern writing data from the storage apparatus 140 and generates shot data specific to the writing apparatus 100 by performing data conversion processing in a plurality of stages for each pass. The pattern writing data is configured as a file, for example, for each frame region obtained by virtually dividing a chip region of a pattern writing target chip in a thin rectangular shape. Then, the shot division unit 64 successively reads data files for such frame regions to generate shot data. While a plurality of figure patterns is arranged on a chip, the size that can be formed by one beam shot is limited in the writing apparatus 100. Thus, each figure pattern is divided into shot figures that can be formed by one beam shot in data conversion processing. Then, the figure type, size, position and the like of each shot figure are generated as shot data. The shot data is successively stored in the storage apparatus 142. There is a positional shift of the deflection region between the first and second passes and so content of shot data is different. Thus, the shot division unit 64 generates shot data (1) in the first pass and shot data (2) in the second pass respectively and the shot data (1) in the first pass and the shot data (2) in the second pass are stored in the storage apparatus 142.

As the proximity mesh division process (S112), the proximity mesh division unit 62 (second mesh division unit) virtually divides the pattern writing region of the target object 101 into a plurality of proximity meshes 50 (second mesh regions) in a size $Δ_2$ (second mesh size) obtained by dividing the size $Δ_1$ of the TF 40 (first mesh size) by the product of a natural number m and the number of passes N of multiple pattern writing performed by shifting the position.

Figure 5:
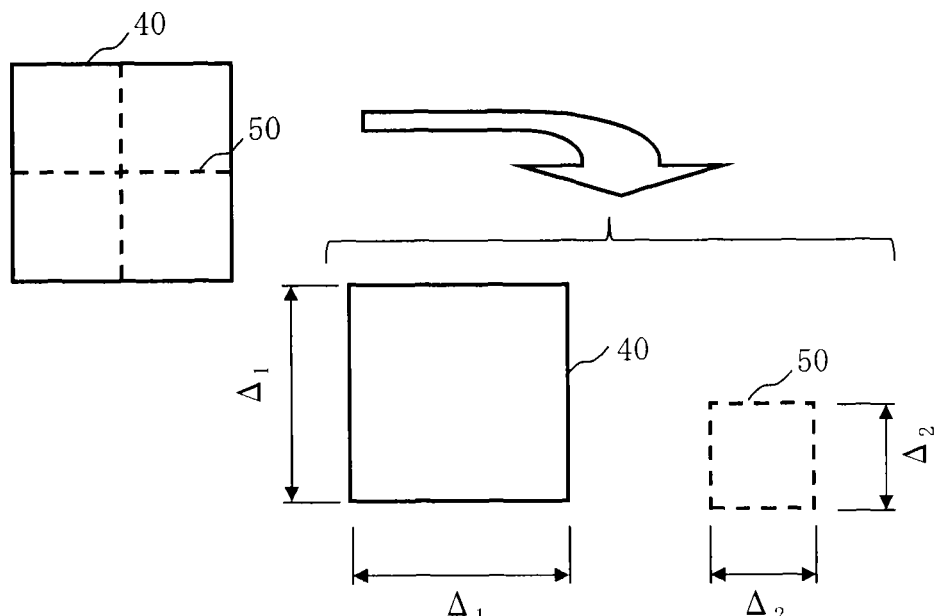
FIG. 5 is a diagram showing TF and a proximity mesh in Embodiment 1.

FIG. 5 is a diagram showing TF and a proximity mesh in Embodiment 1. In FIG. 5, the proximity mesh 50 is divided in the size $Δ_2$ obtained by dividing the x/y size $Δ_1$ of the TF 40 by the number of passes N. Accordingly, the plurality of proximity meshes 50 whose position overlaps with the position of the TF 40 can be prevented from extending over the other neighboring TF 40. In other words, a grid line of the TF 40 and that of the proximity mesh 50 on the outer side match without being shifted. While the proximity mesh 50 is divided in the size of $Δ_1/N$, the size is not limited to the above example. It is only necessary that the relationship $mΔ_2=Δ_1/N$ be satisfied using a natural number m.

As the ρ operation process (S114), the ρ operation unit 66 operates an area density ρ of figure patterns arranged in the proximity mesh 50 for each of the proximity meshes 50. Then, the ρ operation unit 66 creates an area density map using each mesh value.

As the D'(x) operation process (S116), the D'(x) operation unit 70 (first dose operation unit) operates a temporary dose D'(x) (first dose) of an electron beam corrected for the proximity effect for each of the proximity mesh regions 50 by using a dose model using a dose threshold θ. The following formula (1) can be defined as a dose calculation formula of the dose model using the dose threshold θ. In the formula (1), the dose threshold θ, a dose D(x), a pattern area density ρ(x), and a proximity effect kernel G(x) are used as terms. x indicates the position (vector). In other words, it is assumed that the notation x alone means two-dimensional coordinates. The proximity effect kernel G(x) is defined by, for example, the following formula (2):

$$\frac{D(x)}{2} + \int ρ(x')D(x')G(x-x')dx' = θ \quad (1)$$

$$G(x-x') = \frac{η}{πσ^2}\exp\left\{-\frac{(x-x')^2}{σ^2}\right\} \quad (2)$$

In the formula (2), η is a back scattering rate and σ is a back scattering radius.

In Embodiment 1, the above dose model is improved. More specifically, a dose modulation coefficient $\alpha(x)$ to make temperature corrections that correct dimensional variations due to a temperature rise caused by heat transfer originating from irradiation of an electron beam is defined. Further, the temporary dose $D'(x)=D(x)/\alpha(x)$ is defined by using the dose modulation coefficient $\alpha(x)$. Then, the formula (1) is transformed into the following formula (3):

$$\frac{D'(x)}{2} + \int (\rho(x')\alpha(x'))D'(x')G(x-x')dx' = \theta \quad (3)$$

The $D'(x)$ operation unit 70 works out the formula (3) to determine the temporary dose $D'(x)$. In the first calculation, $\alpha(x)=1$ is assumed for the operation. That is, when $\alpha(x)=1$, the formula (3) is the same as the formula (1). The obtained temporary dose $D'(x)$ is a dose corrected for the proximity effect. As will be described later, an iterative operation is performed in the $D'(x)$ operation process (S116) and $\alpha_{ave}(x)$ described later will be used as $\alpha(x)$ in the second and subsequent operations.

As the $D(x)$ map creation process (S118), the $D(x)$ map creation unit 68 first operates $D(x)=\alpha(x) D'(x)$ to operate the dose $D(x)$ for each of the proximity mesh regions 50. Then, the $D(x)$ map creation unit 68 creates a dose $D(x)$ map using the mesh value of each of the proximity mesh regions 50. The dose $D(x)$ here becomes a dose of the whole multiple pattern writing.

As the $D(x)/N$ map creation process (S119), the $D(x)/N$ map creation unit 71 operates a dose $D(x)/N$ for one-time pattern writing by dividing the dose $D(x)$ of the whole multiple pattern writing by the number of passes N for each of the proximity mesh regions 50. The dose $D(x)/N$ is a dose for an applicable pass. Then, the $D(x)/N$ map creation unit 71 creates a dose $D(x)/N$ map using the mesh value of each of the proximity mesh regions 50. The $D(x)/N$ map is stored in the storage apparatus 144.

In a first operation of each process ranging from the $D'(x)$ operation process (S116) to the $D(x)/N$ map creation process (S119) described above, only the proximity effect is corrected and no temperature correction that corrects dimensional variations due to a temperature rise caused by heat transfer originating from irradiation of an electron beam is made. An operation to make the temperature correction will be performed below.

As the T operation process (S120), the T operation unit 73 operates a representative temperature $T(x, t)$ of the TF 40 raised by heat transfer originating from irradiation of the electron beam 200 using the dose $D(x)/N$ of the corresponding pass of the multiple pattern writing of the operated dose $D(x)$, for each pass of multiple pattern writing and each of the TF (first mesh region). Here, for example, a case when the number of passes N is 2 will be described. The T operation unit 73 is an example of a representative temperature operation unit. The representative temperature $T(x, t)$ can be determined by the following formula (4):

$$T(x,t)=\iint \rho(x')(D(x')/N)H(x-x',t-t')dx'dt' \quad (4)$$

In the formula (4), the representative temperature $T(x, t)$ is defined by using the pattern area density $\rho(x)$, the dose $D(x)/N$ for one-time pattern writing, and a thermal diffusion kernel $H(x, t)$. Because, as described above with reference to FIG. 5, a plurality of the proximity meshes 50 whose position overlaps with the position of the TF 40 does not extend over the other neighboring TF 40, the value of the pattern area density $\rho(x)$ operated for each of the proximity meshes 50 can directly be used. Therefore, there is no need to recalculate the pattern area density $\rho(x)$ for each pass. As a result, the operation speed can be made faster. The thermal diffusion kernel $H(x, t)$ shown in the formula (4) can be defined by, for example, the following formula (5):

$$H(x-x', t-t') = \frac{E}{Gd \cdot Cp \cdot Rg} erf\left(\frac{Rg}{2K\sqrt{t-t'}}\right)\frac{1}{4\pi K^2(t-t')}\exp\left\{-\frac{(x-x')^2}{4K^2(t-t')}\right\} \quad (5)$$

In the formula (5), E is electron beam energy [keV], Gd is a gram density [g/cm$^3$] of a substrate material, and Cp is a specific heat [J/((K·g)] of the substrate material. Rg is called the Grun range and is a mean range in the depth direction when an electron beam of energy E [keV] is normally incident on the substrate material of the gram density Gd [g/cm$^3$] and is represented by $Rg=(0.046/Gd)\cdot E^{1.75}$ [μm]. A thermal diffusion coefficient K is defined by $K^2$ [(mm)$^2$/s]=$\lambda$/(Gd·Cp). $\lambda$ is thermal conductivity [W/(K·m)] of the substrate material. When an operation of the formula (4) is performed, $D(x')/N$ uses a value expressed in the unit [fC/μm$^2$] (fC=femtocoulomb). erf( ) is an error function.

The representative temperature $T(x, t)$ is based on, for each of the TF 40, heat transfer from a plurality of the other (n) TF 40 written before the applicable TF 40. Thus, the representative temperature Ti of the TF can be determined by cumulatively adding each temperature rise amount δTij caused by heat transfer from the plurality of the other (n) TF 40 written before the applicable TF. The temperature rise amount δTij shows a temperature rise amount of the i-th TFi caused by heat transfer from the other j-th TFj. The temperature rise amount δTij depends on an elapsed time (ti−tj) between the time when the other TF is written at time tj and the time when the applicable TF is written at time ti. Thus, the representative temperature Ti(T(x, t) of the i-th TF 40) of the applicable TF 40 (i-th TF) is defined as a function of the position x and the time t. The thermal diffusion kernel $H(x, t)$ is defined such that the above content is satisfied by the formula (4).

As the $T_1$ operation process (S122), the $T_1$ operation unit 72 (an example of a representative temperature operation processing unit) operates a representative temperature $T_1(x, t)$ in the first pass of the TF 40 rising due to heat transfer originating from irradiation of the electron beam 200 for each of the TF 40 (first mesh region) in the first pass using the dose $D(x)/N$ in the first pass. The $T_1$ operation unit 72 is an example of the representative temperature operation unit of a plurality of passes.

As the $T_2$ operation process (S124), the $T_2$ operation unit 74 (an example of the representative temperature operation processing unit) operates a representative temperature $T_2(x, t)$ in the second pass of the TF 40 rising due to heat transfer originating from irradiation of the electron beam 200 for each of the TF 40 (first mesh region) in the second pass using the dose $D(x)/N$ in the second pass. The $T_2$ operation unit 74 is an example of the representative temperature operation unit of a plurality of passes.

As the α operation process (S130), the α operation unit 77 operates a dose modulation coefficient $\alpha(x, t)$ for each of the TF 40 (first mesh regions) and each pass of the multiple pattern writing using the applicable representative temperature $T(x, t)$. The dose modulation coefficient $\alpha(x, t)$ is defined as a function $\alpha(T(x, t))$ dependent on the representative temperature $T(x, t)$. Because, as described above, the representative temperature Ti is dependent on the position x and the time t, the dose modulation coefficient α(x, t) is also dependent on the position x and the time t. Content of the function α(T(x, t)) may be defined by, for example, fitting data obtained from an experiment or the like. The α operation unit 77 is an example of a dose modulation coefficient operation unit.

As the $\alpha_1$ operation process (S132), the $\alpha_1$ operation unit 76 (an example of the dose modulation coefficient operation processing unit) operates a dose modulation coefficient $\alpha_1$(x, t) in the first pass for each of the TF 40 (first mesh regions) in the first pass using the representative temperature $T_1$(x, t) in the first pass. The $\alpha_1$ operation unit 76 is an example of the dose modulation coefficient operation unit of a plurality of passes.

As the $\alpha_2$ operation process (S134), the $\alpha_2$ operation unit 78 (an example of the dose modulation coefficient operation processing unit) operates a dose modulation coefficient $\alpha_2$(x, t) in the second pass for each of the TF 40 (first mesh regions) in the second pass using the representative temperature $T_2$(x, t) in the second pass. The $\alpha_2$ operation unit 78 is an example of the dose modulation coefficient operation unit of a plurality of passes.

As the $\alpha_{ave}$ map creation process (S140), the $\alpha_{ave}$ map creation unit 80 operates an average dose modulation coefficient $\alpha_{ave}$(x, t) as an average value of the dose modulation coefficient α(x, t) of each overlapping pass for each of a plurality of sub-TF (third mesh regions) obtained by virtually dividing the TF 40 in a mesh size $\Delta_3$ (third mesh size) obtained by dividing the TF size $\Delta_1$ by the product of a natural number n and the number of passes N. The $\alpha_{ave}$ map creation unit 80 is an example of an average operation unit. Then, the $\alpha_{ave}$ map creation unit 80 creates an average dose modulation coefficient map using the mesh value of each sub-TF.

Figure 6:
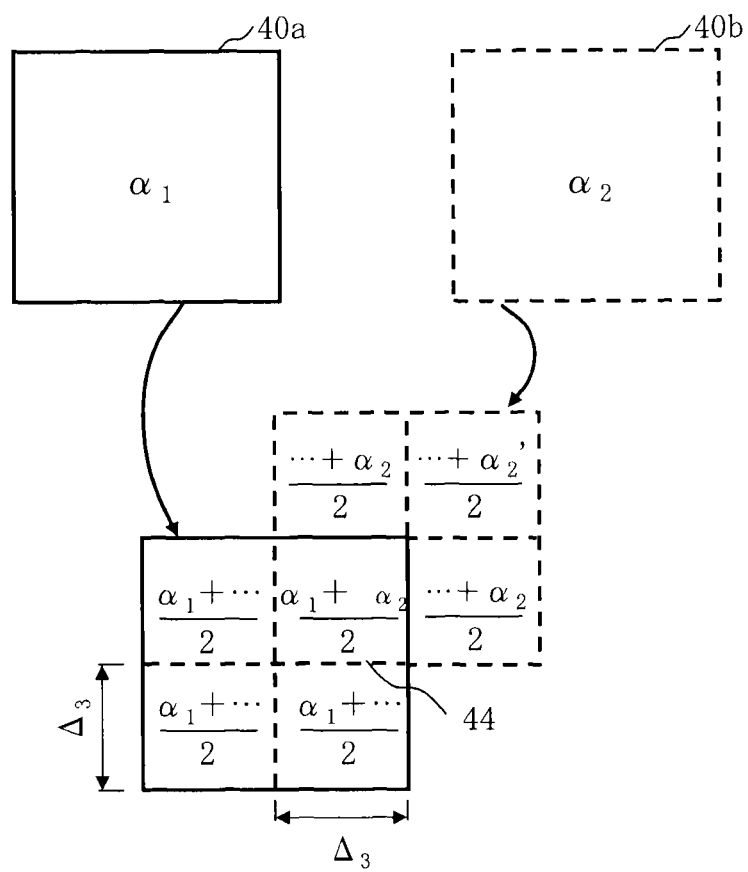
FIG. 6 is a conceptual diagram illustrating an average dose modulation coefficient in Embodiment 1.

FIG. 6 is a conceptual diagram illustrating the average dose modulation coefficient in Embodiment 1. In FIG. 6, the unique dose modulation coefficient $\alpha_1$(x, t) is operated for each of the TF 40a in the first pass indicated by a solid line. Similarly, the unique dose modulation coefficient $\alpha_2$(x, t) is operated for each of the TF 40b in the second pass indicated by a dotted line. As shown in FIG. 6, the TF 40 is virtually divided into a plurality of sub-TF 44 in the mesh size $\Delta_3$ (third mesh size) obtained by dividing the TF size $\Delta_1$ by the product of a natural number n and the number of passes N. In such an operation, the natural number m is a natural number times as large as the natural number n. Here, a case of n=1 is shown, but n may be a natural number equal to 2 or greater. The position of the TF 40a in the first pass is shifted from that of the TF 40b in the second pass by half the mesh size in the x and y directions and thus, the TF 40a in the first pass and the TF 40b in the second pass corresponding to each other have ¼ the mesh region overlapping with each other. ¾ the region remaining of the TF 40a in the first pass overlap with the other TF 40b in each ¼ the region respectively. Similarly, ¾ the region remaining of the TF 40b in the second pass overlap with the other TF 40a in each ¼ the region respectively. Thus, as many different dose modulation coefficients α(x, t) as the number of passes N exist for each of the sub-TF 44. In the example of FIG. 6, a case when the number of passes N=2 is shown and thus, $\alpha_1$(x, t) and $\alpha_2$(x, t) exist for each of the sub-TF 44. In Embodiment 1, the average value of the dose modulation coefficients α(x, t) is calculated for each of the sub-TF 44. Accordingly, a unique average dose modulation coefficient $\alpha_{ave}$(x, t) can be defined for each of the sub-TF 44.

Thus, the dose modulation coefficient (average dose modulation coefficient $\alpha_{ave}$(x, t)) can be determined for each of the sub-TF 44. However, if the dose D(x)/N is modulated using the average dose modulation coefficient $\alpha_{ave}$(x, t), residuals arise in the proximity effect corrections. Thus, in Embodiment 1, an iterative operation is performed as described below to suppress such residuals.

As the θ' operation process (S142), the θ' operation unit 82 operates a polynomial (6) having a term obtained by multiplying the average dose modulation coefficient $\alpha_{ave}$(x, t) (an example of the dose modulation coefficient) based on the representative temperature of each pass by the pattern area density ρ(x) for each of the proximity mesh regions 50 (second mesh regions) as an element. The θ' operation unit 82 is an example of a polynomial operation unit.

$$\theta' = \frac{D'(x)}{2} + \int (\rho(x')\alpha_{ave}(x'))D'(x')G(x-x')dx' \qquad (6)$$

The threshold θ' of the formula (6) is the same as an operation result of the left side of the formula (3). The average dose modulation coefficient $\alpha_{ave}$(x, t) is used as the dose modulation coefficient α(x) in the formula (6). In such an operation, the mesh size $\Delta_3$ of the sub-TF 44 is a natural number times as large as the mesh size $\Delta_2$ of the proximity mesh region 50. Thus, the proximity mesh region 50 whose position overlaps with the position of the sub-TF 44 does not extend over the other neighboring sub-TF 44 and thus, the value of the pattern area density ρ(x) operated for each of the proximity meshes 50 can directly be used. Similarly, the proximity mesh region 50 whose position overlaps with the position of the sub-TF 44 does not extend over the other neighboring sub-TF 44 and thus, the value of the average dose modulation coefficient $\alpha_{ave}$(x, t) operated for each of the sub-TF 44 can directly be used. Therefore, the operation time can be shortened. In other words, the operation speed can be made faster.

As the determination process (S144), the determination unit 84 determines whether the absolute value |θ−f'| of a difference between the value θ' obtained by operating the polynomial (6) and the dose threshold θ shown in the formula (3) is within a tolerance θth.

Figure 7:
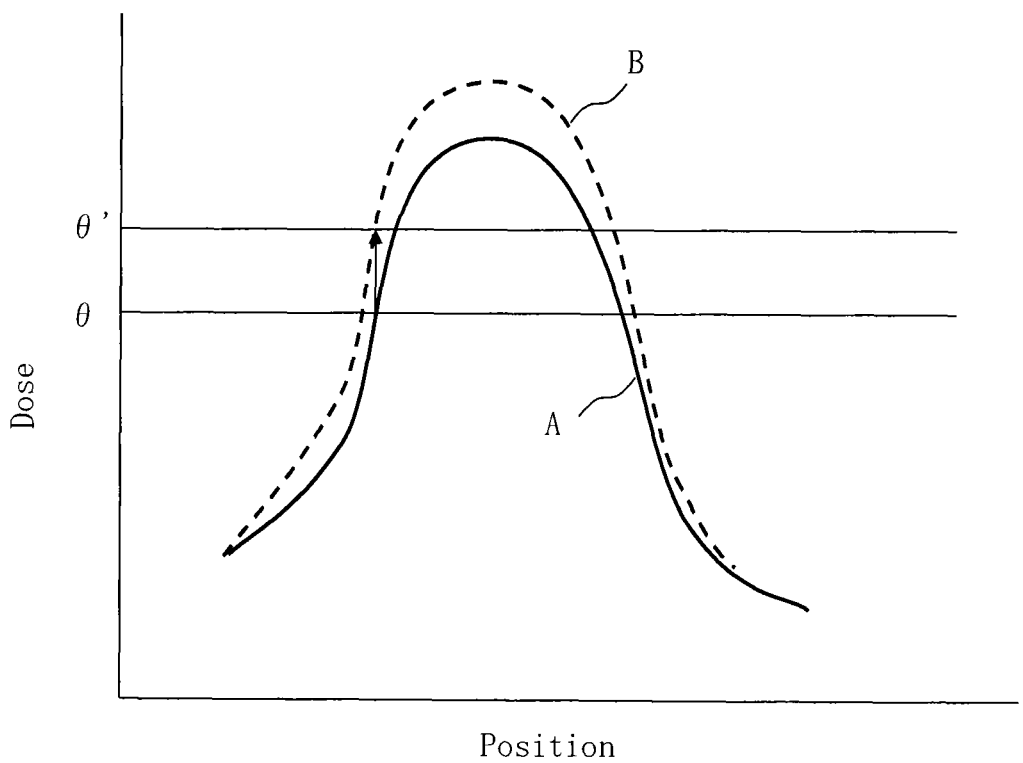
FIG. 7 is a diagram showing an example of a beam profile in Embodiment 1.
Figure 8:
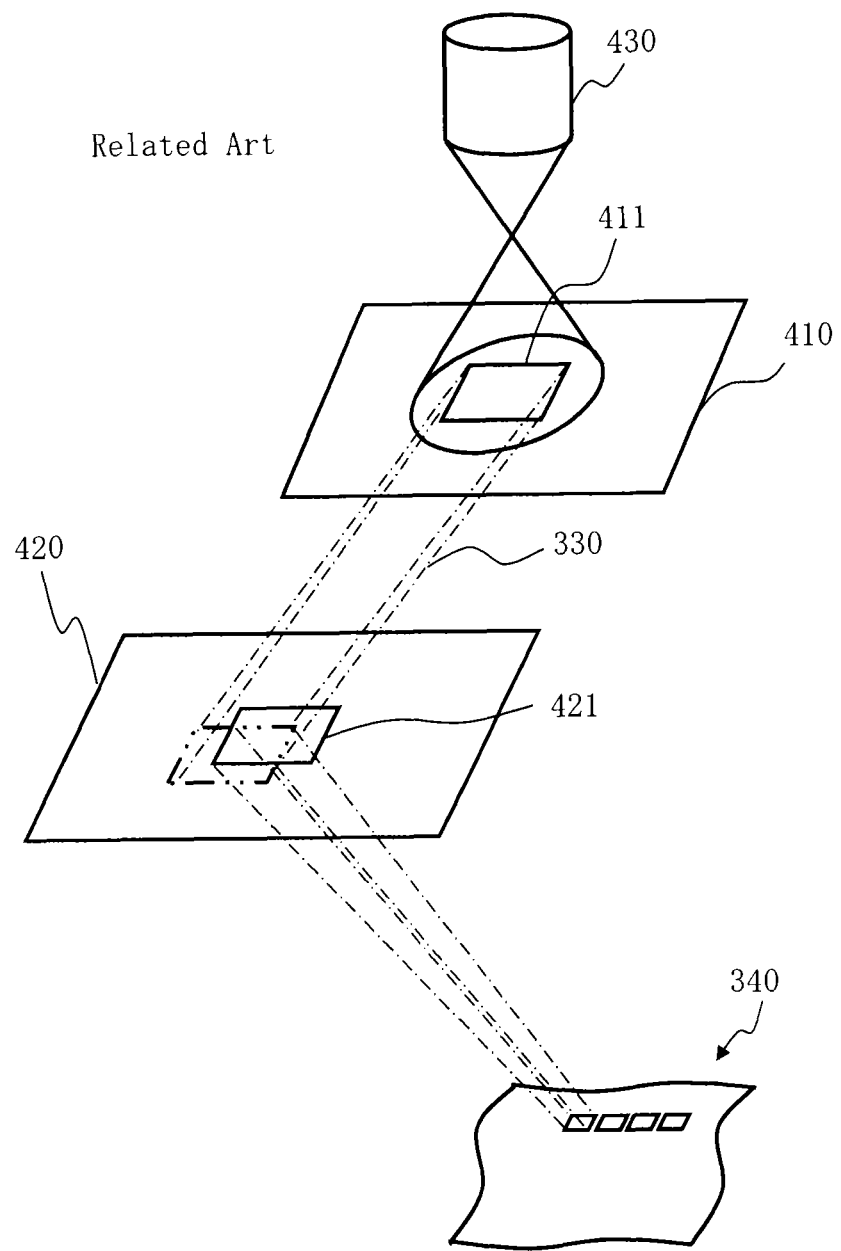
FIG. 8 is a conceptual diagram illustrating an operation of a variable-shaped electron beam writing apparatus.

FIG. 7 is a diagram showing an example of a beam profile in Embodiment 1. In FIG. 7, the vertical axis represents the dose and the horizontal axis represents the position. In a beam profile A based on the dose D(x) obtained in the D'(x) operation process (S116) and the D(x) map creation process (S118), the dose model is designed such that the beam size and the pattern line width are decided in the position of the threshold θ. In contrast, the beam profile A is modulated into a beam profile B by modulating the dose using the dose modulation coefficient α(x). If the dose of the beam profile B is used for pattern writing, the beam size and the pattern line width are decided in the position of the threshold θ'. Thus, a deviation from the design pattern line width occurs. In other words, residuals arise in the proximity effect corrections.

Thus, in Embodiment 1, each process from the D'(x) operation process (S116) to the determination process (S144) is repeated in the determination process (S144) until the absolute value |θ−θ'| of the difference is within the tolerance θth. In the D'(x) operation process (S116), the average dose modulation coefficient $\alpha_{ave}$(x, t) obtained immediately before is used as the dose modulation coefficient α(x) for operation.

That is, the D'(x) operation unit 70 repeatedly performs the operation of the dose D'(x) of an electron beam corrected for the proximity effect until the absolute value |θ−θ'| of the difference is within the tolerance θth and the D(x) map creation unit 68 creates a D(x) map each time. Then, the T operation unit 73 repeatedly performs the operation of the representative temperature T(x, t) for each TF and each pass until the absolute value |θ−θ'| of the difference is within the tolerance θth using a new dose D(x)/N for the applicable pass of multiple pattern writing of new re-operated doses. Then, the α operation unit 77 repeatedly performs the operation of the dose modulation coefficient α(T(x, t)) for each TF and each pass until the absolute value |f−f'| of the difference is within the tolerance θth using a new re-operated representative temperature T(x, t). The $\alpha_{ave}$ map creation unit 80 operates an average value of the dose modulation coefficient α(T (x, t)) for each new re-operated TF and each pass. Then, the θ' operation unit 82 repeats the operation of the polynomial (6) until the absolute value |θ−θ'| of the difference is within the tolerance θth using the new average dose modulation coefficient $\alpha_{ave}(x, t)$ based on a new re-operated representative temperature and a value obtained by dividing a new re-operated dose D(x) by the new average dose modulation coefficient $\alpha_{ave}(x, t)$. Then, the determination unit 84 determines whether the absolute value |θ−θ'| of the difference between the value θ' obtained by operating the new polynomial (6) and the new dose threshold θ shown in the formula (3) is within the tolerance θth.

By executing each of the above processes, temperature corrections can also be made while correction residuals of the proximity effect are suppressed.

According to Embodiment 1, as described above, dimensional variations of patterns due to resist heating can efficiently be suppressed while correction residuals of the proximity effect are suppressed even if multiple pattern writing is performed.

As the pattern writing process (S146), the pattern writing controller 86 starts pattern writing processing by controlling the pattern writing unit 150 via the deflection control circuit 120 or the like. The pattern writing unit 150 writes a pattern on the target object 101 using the electron beam 200 of the dose D(x) that makes the absolute value |θ−θ'| of a difference between a value obtained by operating a polynomial and the dose threshold within the tolerance θth. More specifically, the operation will be as described below. The deflection control circuit 120 acquires the beam irradiation time from a D(x)/N map that is stored in the storage apparatus 144 and makes the absolute value |f−f'| of the difference within the tolerance θth. Then, the deflection control circuit 120 outputs a digital signal controlling the beam irradiation time of each shot to the DAC amplifier unit 130. Then, the DAC amplifier unit 130 converts the digital signal into an analog signal and amplifies the signal before applying the signal to the blanking deflector 212 as a deflection voltage.

The electron beam 200 emitted from the electron gun assembly 201 (emission unit) is controlled by the blanking deflector 212 during the passage through the blanking deflector 212 so as to pass through the blanking aperture plate 214 in a beam ON state and is deflected such that the whole beam is shielded by the blanking aperture plate 214 in a beam OFF state. The electron beam 200 having passed through the blanking aperture plate 214 while the beam OFF state changes to the beam ON state and then to the beam OFF state becomes one shot of the electron beam. The blanking deflector 212 controls the orientation of the passing electron beam 200 to alternately generate a beam ON state and a beam OFF state. For example, no voltage may be applied in a beam ON state and a voltage may be applied to the blanking deflector 212 to change to a beam OFF state. The dose per shot of the electron beam 200 with which the target object 101 is irradiated is adjusted by the beam irradiation time of each shot.

The electron beam 200 of each shot generated by passing through the blanking deflector 212 and the blanking aperture plate 214 as described above illuminates the whole first shaped aperture plate 203 having a rectangular hole with the illumination lens 202. Here, the electron beam 200 is first shaped in a rectangular, for example, oblong shape. Then, the electron beam 200 in a first aperture image after passing through the first shaped aperture plate 203 is projected onto the second shaped aperture plate 206 by the projection lens 204. The first aperture image on the second shaped aperture plate 206 is controlled to be deflected by the deflector 205 so that the beam shape and dimensions thereof can be changed (variably shaped). Such variable shaping is performed for each shot and normally, a different beam shape and different dimensions are shaped by each shot. Then, the electron beam 200 in a second aperture image after passing through the second shaped aperture plate 206 is focused by the objective lens 207 and deflected by the main deflector 208, the sub-deflector 209, and the sub-sub-deflector 216 before being irradiated in a desired position of the target object 101 arranged on the continuously moving XY stage 105. In this manner, a plurality of shots of the electron beam 200 is successively deflected onto the target object 101 to be a substrate by each deflector.

According to Embodiment 1, as described above, correction residuals of the proximity effect can be suppressed while operations being efficiently performed so that the correction calculation speed does not lag behind the pattern writing speed and also dimensional variations of patterns due to resist heating can be suppressed. Therefore, a pattern can be written in high-precision dimensions.

In the foregoing, an embodiment has been described with reference to concrete examples. However, the present disclosure is not limited to such concrete examples. In the above example, the first $\alpha_{ave}$ map is created in the writing apparatus 100, but the present disclosure is not limited to such an example. The first $\alpha_{ave}$ map may be created in an external apparatus by performing operations from the TF mesh division process (S102) to the $\alpha_{ave}$ map creation process (S140). Then, the externally created first $\alpha_{ave}$ map may be input and stored in, for example, the storage apparatus 140 by the writing apparatus 100. In such a case, the T operation process (S120), the α operation process (S130), and the $\alpha_{ave}$ map creation process (S140) in the first operation flow of the iterative operation can be omitted. According to the above configuration, the operation time can be shortened correspondingly.

Though the description of those portions that are not directly needed for the description of the present disclosure such as the apparatus configuration and control techniques is omitted, the needed apparatus configuration or control techniques can appropriately be selected and used. For example, while the description of the configuration of a controller that controls the writing apparatus 100 is omitted, it is needless to say that the needed configuration of the controller is appropriately selected and used.

In addition, all charged particle beam writing apparatuses and methods and all methods for acquiring a dose modulation coefficient of a charged particle beam including elements of the present disclosure and whose design can appropriately be changed by persons skilled in the art are included in the scope of the present disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a first mesh division unit configured to virtually divide a pattern writing region of a target object into a plurality of first mesh regions in a first mesh size;
a second mesh division unit configured to virtually divide the pattern writing region of the target object into a plurality of second mesh regions in a second mesh size obtained by dividing the first mesh size by a product of a natural number and a number of passes of multiple pattern writing performed by shifting a position;
a first dose operation unit configured to operate a first dose of a charged particle beam corrected for a proximity effect for each of the plurality of second mesh regions by using a dose model using a dose threshold;
a representative temperature operation unit configured to operate a representative temperature of the first mesh region rising due to heat transfer originating from irradiation of the charged particle beam by using a dose for an applicable pass of the multiple pattern writing of the first dose operated, for each pass of the multiple pattern writing and each of the plurality of first mesh regions;
a polynomial operation unit configured to operate a polynomial having a term obtained by multiplying a dose modulation coefficient based on the representative temperature of each pass by a pattern area density for each of the plurality of second mesh regions as an element; and
a pattern writing unit configured to write a pattern on the target object by using a charged particle beam of a dose that makes a difference between a value obtained by operating the polynomial and the dose threshold within a tolerance.

2. The apparatus according to claim 1, further comprising:
a determination unit configured to determine whether the difference between the value obtained by operating the polynomial and the dose threshold is within the tolerance,
wherein the first dose operation unit further performs an operation of the dose of the charged particle beam corrected for the proximity effect repeatedly until the difference is within the tolerance,
the representative temperature operation unit repeats an operation of the representative temperature for each of the plurality of first mesh regions until the difference is within the tolerance by using a new dose for the applicable pass of the multiple pattern writing of a new re-operated first dose, and
the polynomial operation unit repeats an operation of the polynomial until the difference is within the tolerance by using a new dose modulation coefficient based on a new re-operated representative temperature and a value obtained by dividing the new re-operated first dose by the new dose modulation coefficient.

3. The apparatus according to claim 1, wherein an average value of dose modulation coefficients of each pass overlapping with each other in the multiple pattern writing is used as the dose modulation coefficient.

4. The apparatus according to claim 1, further comprising:
a dose modulation coefficient operation unit configured to operate the dose modulation coefficient by using the representative temperature, for each of the plurality of first mesh regions and each pass of the multiple pattern writing; and
an average value operation unit configured to operate an average value of dose modulation coefficients of each pass overlapping with each other for each of a plurality of third mesh regions obtained by virtually dividing the first mesh region by a third mesh size obtained by dividing the first mesh size by a product of a natural number and the number of passes.

5. The apparatus according to claim 1, further comprising:
an area density operation unit configured to operate an area density of figure patterns arranged in an applicable second mesh region for each of the plurality of second mesh regions.

6. The apparatus according to claim 2, further comprising:
a second dose operation unit configured to operate a second dose obtained by multiplying the dose modulation coefficient by the first dose for each of the second mesh regions.

7. The apparatus according to claim 6, further comprising:
a third dose operation unit configured to operate a third dose for one-time pattern writing obtained by dividing the second dose by the number of passes of the multiple pattern writing for each of the plurality of second mesh regions.

8. The apparatus according to claim 7, wherein the representative temperature operation unit uses the third dose for the operating whose iteration count is two or thereafter.

9. The apparatus according to claim 1, wherein the representative temperature operation unit includes a plurality of representative temperature operation processing units in accordance with the number of passes of the multiple pattern writing that operates the respective representative temperature for a corresponding pass of the multiple pattern writing.

10. The apparatus according to claim 4, wherein the dose modulation coefficient operation unit includes a plurality of dose modulation coefficient operation processing units in accordance with the number of passes of the multiple pattern writing that operates the respective dose modulation coefficient for a corresponding pass of the multiple pattern writing.

11. A method for acquiring a dose modulation coefficient of a charged particle beam comprising:
virtually dividing a pattern writing region of a target object into a plurality of first mesh regions in a first mesh size;
virtually dividing the pattern writing region of the target object into a plurality of second mesh regions in a second mesh size obtained by dividing the first mesh size by a product of a natural number and a number of passes of multiple pattern writing performed by shifting a position;
operating a first dose of a charged particle beam corrected for a proximity effect for each of the plurality of second mesh regions by using a dose model using a dose threshold;
operating a representative temperature of the first mesh region rising due to heat transfer originating from irradiation of the charged particle beam by using a dose of an applicable pass of the multiple pattern writing of the first dose operated, for each pass of the multiple pattern writing and each of the plurality of first mesh regions;
operating a dose modulation coefficient to correct dimensional variations due to resist heating by using the representative temperature, for each pass of the multiple pattern writing and each of the plurality of first mesh regions; and
operating and outputting an average value of dose modulation coefficients for each of a plurality of third mesh regions obtained by virtual division in a third mesh size obtained by dividing the first mesh size by a product of a natural number and the number of passes.

* * * * *